United States Patent
Jammy et al.

(10) Patent No.: US 6,724,088 B1
(45) Date of Patent: Apr. 20, 2004

(54) QUANTUM CONDUCTIVE BARRIER FOR CONTACT TO SHALLOW DIFFUSION REGION

(75) Inventors: Rajarao Jammy, Wappingers Falls, NY (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 497 days.

(21) Appl. No.: 09/295,132

(22) Filed: Apr. 20, 1999

(51) Int. Cl.$^7$ .............................................. H01L 23/48
(52) U.S. Cl. ...................... 257/767; 257/751; 257/754; 257/382
(58) Field of Search ................................ 257/751, 767, 257/754, 382

(56) References Cited

U.S. PATENT DOCUMENTS

| | | | | |
|---|---|---|---|---|
| 4,043,848 A | * | 8/1977 | Bazin | 148/187 |
| 4,141,022 A | * | 2/1979 | Sigg et al. | 357/23 |
| 4,691,219 A | | 9/1987 | Goth | 357/34 |
| 4,833,094 A | | 5/1989 | Kenney | 437/47 |
| 5,051,786 A | | 9/1991 | Nicollian et al. | 357/4 |
| 5,185,689 A | * | 2/1993 | Maniar | 361/313 |
| 5,216,282 A | | 6/1993 | Cote et al. | 257/773 |
| 5,300,455 A | * | 4/1994 | Vuillermoz et al. | 437/190 |
| 5,363,327 A | | 11/1994 | Henkles et al. | 365/149 |
| 5,371,410 A | * | 12/1994 | Chen et al. | 257/750 |
| 5,387,548 A | * | 2/1995 | Cho | 437/184 |
| 5,612,254 A | * | 3/1997 | Mu et al. | 438/195 |
| 5,614,431 A | | 3/1997 | DeBrosse | 437/52 |
| 5,648,861 A | | 7/1997 | Natsuhori | 349/116 |
| 5,654,567 A | * | 8/1997 | Numata et al. | 257/306 |
| 5,689,139 A | * | 11/1997 | Bui et al. | 257/758 |
| 5,714,418 A | * | 2/1998 | Bai et al. | 438/627 |
| 5,792,703 A | | 8/1998 | Bronner et al. | 438/620 |
| 5,801,916 A | * | 9/1998 | New | 361/321.4 |
| 6,037,263 A | * | 3/2000 | Chang | 438/712 |

FOREIGN PATENT DOCUMENTS

| EP | 499249 A2 | * | 8/1992 | ......... H01L/23/485 |
|---|---|---|---|---|

OTHER PUBLICATIONS

"Fundamentals of Semiconducotro Processing Technologies" by B. El–Kareh, Kluwer Academic Publishers, (1995), p. 534–546.

* cited by examiner

Primary Examiner—Eddie Lee
Assistant Examiner—Eugene Lee
(74) Attorney, Agent, or Firm—Steven Capella

(57) ABSTRACT

Structures such as source/drain contacts of improved reliability are enabled by the creation and use of quantum conductive barrier layers at the interface between the electrical contact and the shallow diffusion source/drain region. The quantum conductive layers are preferably nitrides or oxynitrides. The improved structure is preferably part of a transistor structure of an integrated circuit device. The contacts structures are especially useful for devices employing ultra-shallow junctions.

9 Claims, 1 Drawing Sheet

QUANTUM CONDUCTIVE BARRIER FOR CONTACT TO SHALLOW DIFFUSION REGION

BACKGROUND OF THE INVENTION

In construction of microelectronic devices, it is well known that there is a constant pressure for reduction of device size and/or increase of device capability at a given scale.

In the actual construction of reduced scale devices, attention must be paid to higher precision in configuring the materials from which the device components are formed. Attention must also be paid to the interaction of the various materials used in device construction during the device manufacture process, during device testing, and during device operation. In this regard, finer sized device components are more sensitive to adverse materials interactions since the amount of material forming the component is smaller. For example, an interaction that might have only affected the border area of a large component would affect an entire component of smaller scale (e.g., where the scale of the smaller component is the same size as the border area of the larger component). Thus, reduction in component scale forces consideration of materials interaction problems which could have been viewed as non-critical for larger scale components.

In the context of devices such as MOSFET transistors in semiconductor substrates, various materials are used to form the components of the transistor such as the source and drain diffusion regions, electrical contacts (studs) to the diffusion regions, various dielectric regions, gate conductor, gate oxide, etc. For example, the studs are typically metal (i.e. tungsten) or a highly doped polycrystalline silicon (polysilicon) material whereas the source and drain diffusion regions may be very shallow regions of more precise dopant level in the monocrystalline semiconductor substrate. The successful functioning of the transistor depends in part on the ability of these diverse materials to maintain their original or desirably modified character during manufacture/useful life of the device.

Unfortunately, the nature of these materials is such that unwanted interactions may occur unless otherwise prevented. For example, ultra-shallow junctions (required for scalability of MOSFETs to channel lengths significantly shorter than 100 nm) present challenges to successfully forming contacts to source/drain diffusions.

In particular with ultra-shallow junctions, the contact metallurgy (the conductive stud) is prone to "spike through" to the junction edge, which results in excessive leakage currents. One technique which is commonly employed in the art avoids contact metallurgy "spike through" by forming a locally deep junction in the contact hole prior to the deposition of the conductive stud material. Additionally, in the absence of an additional deeper diffusion, crystal defects are likely to propagate from the interface between the contact metallurgy and the silicon substrate into the depletion region of the source-drain diffusion. These silicon defects also result in increased junction leakage currents. Although this deeper diffusion is spaced away from the gate conductor its presence still degrades the short channel characteristics of the MOSFET, since ultra-short channel MOSFETs are very sensitive to junction depth. Furthermore, because of alignment tolerance the proximity of the deeper diffusion to the gate edge may vary randomly. This results in statistical variation of the electrical characteristics of the MOSFET. Therefore, the prior art technique used for contacting source-drain diffusions does not allow the MOSFET to be scaled in an optimal manner.

Additionally, the contact metallurgy may interact with the monocrystalline semiconductor substrate altering the doping of the diffusion in an undesirable manner. In the case of a tungsten stud, dopant may diffuse from the junction into the stud. This lowers the average doping concentration and increases the resistance of the diffusion. Increased diffusion resistance slows the switching speed of the MOSFET. For a polysilicon stud, which is customarily heavily doped to provide low resistance, dopant from the stud may diffuse into the semiconductor substrate. The out-diffusion from the stud may result in an excessively deep diffusion, which degrades the electrical characteristics (i.e. poorer threshold voltage control, increased off-state leakage current) of the MOSFET.

One approach to avoid unwanted interaction has been to employ an intrinsically conductive compound barrier (e.g. TiN or suicide) between the stud and the shallow source/drain diffusion region. See for example, the discussion in "Fundamentals of Semiconductor Processing Technologies" by B. El-Kareh, Kluwer Academic Publishers, (1995), p. 534–546. These modifications may introduce other materials interaction problems and/or add significantly to the cost/complexity of the fabrication process.

Thus, there is a desire for improved contact structures which allow better control of materials interactions to enable construction of reliable reduced scale transistor devices. It is also desired to meet these needs in an economical manner that minimizes or avoids compromise of other device or component properties.

SUMMARY OF THE INVENTION

The invention provides technology which enables contact structures of improved reliability and performance. More specifically, the invention enables improved contact between conductive studs and shallow diffusion regions by incorporation of a quantum conductive barrier layer at the interface between the conductive stud and shallow diffusion region.

In one aspect, the invention encompasses a structure on a semiconductor substrate, the structure comprising (a) a shallow doped region in the substrate, and (b) an electrical contact to the shallow doped region, wherein the structure further comprises (c) a quantum conductive barrier layer between the doped region and the electrical contact, the doped region being in electrically connected to the electrical contact through the quantum conductive barrier layer.

The invention further encompasses MOSFET transistor structures containing the quantum conductive barriers of the invention at the interfaces between the conductive studs and the source and drain diffusion regions.

In another aspect, the invention encompasses a method of forming a structure on a semiconductor substrate, the structure comprising (a) a shallow doped region in the substrate, (b) an electrical contact to the shallow doped region, and (c) a quantum conductive barrier layer between the doped region and said electrical contact, the method comprising:
 (a) providing a monocrystalline semiconductor substrate having a shallow doped region with an exposed surface,
 (b) forming a quantum conductive layer on the exposed surface, and
 (c) forming a conductive contact over the quantum conductive layer.

Preferred quantum conductive barrier layer materials are silicon nitride or silicon oxynitride. The quantum conductive layer(s) is preferably formed by reacting the exposed surface of the shallow doped region with a nitrogen compound.

These and other aspects of the invention are described in further detail below.

DETAILED DESCRIPTION OF THE INVENTION

Figure 1:
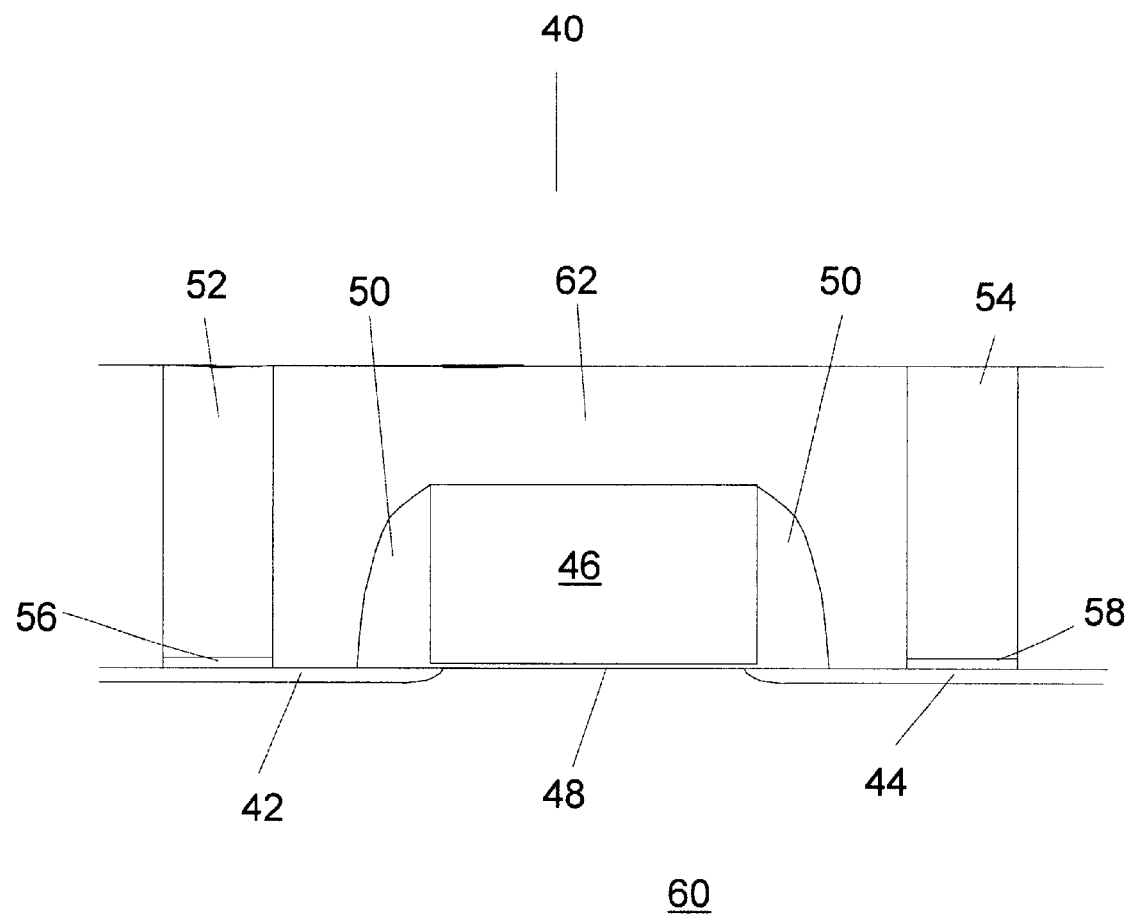
FIG. 1 is a schematic cross section of a MOSFET transistor showing the quantum conductive barrier layers of the invention.

The invention provides contact structures of improved reliability and performance. More specifically, the invention enables improved contact between conductive studs and shallow diffusion regions by incorporation of a quantum conductive barrier layer at the interface between the conductive stud and shallow diffusion region. The invention also provides methods for making these structures.

The quantum conductive layers of the invention are very thin films of materials which in their bulk properties would be considered dielectrics (i.e., electrical insulators). In very thin layers, however, these materials become electrically conductive. Advantageously, these thin layers also have the ability (a) to prevent or slow diffusion of chemical species from one side of the layer to the other. The bulk resistivity (measured in a thick section at 25° C.) of the materials used to make up the quantum conductive layers of the invention is preferably at least about $10^6$ ohm-m, more preferably at least about $10^8$ ohm-m, most preferably at least about $10^{11}$ ohm-m.

The quantum conductive layer preferably has a thickness of about 50 Å or less, more preferably about 5–30 Å, most preferably about 5–15 Å. The resulting layers preferably have a film resistance of less than about 1 K-ohm-$\mu m^2$, more preferably less than about 100 ohm-$\mu m^2$. The series resistance introduced by the quantum conductive layer is equal to the film resistance (ohm-$\mu m^2$) divided by the cross-sectional area ($\mu m^2$) of the quantum conductive layer normal to the direction of current.

The quantum conductive layers of the invention are preferably substantially uniform, however some variation in thickness may be permissible. Preferably, the layer thickness is kept in a range permitting the quantum conductive effect to take place for all points on the layer while performing the desired barrier function.

Preferred quantum conductive materials are inorganic oxides or nitrides, more preferably silicon nitride compounds selected from the group consisting of silicon nitride or silicon oxynitride. These compounds may be stoichiometric or non-stoichiometric. Alternatively, other ceramic materials, such as, for example, alumina, germanium oxide, yttria-stabilized zirconia or other forms of zirconia may be used. The layer composition may be determined by secondary ion mass spectroscopy (SIMS) or other suitable technique.

The invention encompasses structures comprising (a) a shallow doped region in a semiconductor substrate, and (b) an electrical contact to the shallow doped region, wherein the structure further comprises (c) a quantum conductive barrier layer between the doped region and the electrical contact, the doped region being in electrically connected to the electrical contact through the quantum conductive barrier layer. The invention is not limited to any specific device configuration incorporating the structures of the invention, however, the structures of the invention are preferably incorporated into a MOSFET or other transistor devices. Examples of various transistor structures are disclosed in U.S. Pat. Nos. 4,691,219; 4,833,094; 5,216,282; 5,363,327; 5,614,431; and 5,792,703, the disclosures of which are incorporated herein by reference.

FIG. 1 illustrates one embodiment of the invention. FIG. 1 shows a schematic side view of a MOSFET 40 in a substrate 60. Shallow source/drain diffusions (doped regions) 42 and 44 are formed in substrate 60. A gate conductor 46 is formed over a gate oxide 48 between the source/drain diffusions. Side wall spacer 50 is preferably located along the sides of gate conductor 46. Conductive studs 52 and 54 contact diffusions 42 and 44 through quantum conductive barrier layers 56 and 58 respectively. Conductive studs 52 and 54 are separated from the gate conductor stack by insulating layer 62.

The quantum conductive layer of the invention, located at the interface between the conductive studs and the shallow diffusions advantageously acts to prevent or inhibit diffusion of dopants from the studs to the diffusions and further into substrate 60. Thus, the quantum conductive layer minimizes any deepening of the shallow diffusions caused by unwanted dopant migration from the conductive studs.

The invention is not limited to any specific material compositions for the various components of the shallow diffusions, the conductive studs or other components. If desired, materials described in the art for forming MOSFETs or other devices employing shallow diffusions may be used. Thus, the studs 52 and 54 would typically be made of tungsten or a doped polycrystalline silicon. Substrate 60 would typically be a monocrystalline semiconductor material (most typically silicon, lightly doped silicon or silicon having lightly doped bands). The shallow diffusions would typically be formed by diffusing an appropriate N-type or P-type dopant into the substrate. The insulating layer(s) is typically a silicon dioxide. If present, the gate conductor may be a doped polysilicon or other conductive gate stack composition. The sidewall may be a silicon oxide, silicon nitride, or other appropriate insulating material.

Transistor devices or other structures of the invention containing the quantum conductive layers between conductive studs and shallow diffusions may be formed by inserting a quantum conductive layer formation step at an appropriate point(s) in the overall transistor (or other device) manufacturing process. The overall manufacturing process used may be any of those disclosed known in the art such as those described in the patents mentioned above. Alternatively, other variations on manufacturing processes for transistors (or other structures involving contact between a conductive stud and shallow diffusion) may be used.

In one embodiment, the invention encompasses a method of forming a structure on a semiconductor substrate, the structure comprising (a) a shallow doped region in the substrate, (b) an electrical contact to the shallow doped region, and (c) a quantum conductive barrier layer between the doped region and said electrical contact, the method comprising:

(a) providing a monocrystalline semiconductor substrate having a shallow doped region with an exposed surface, (b) forming a quantum conductive layer on the exposed surface, and (c) forming a conductive contact over the quantum conductive layer.

The shallow source-drain diffusions may be formed by using methods such as very low energy ion implantation, plasma immersion doping, or doping from a solid source in combination with laser annealing to limit the thermal budget. These methods allow source-drain junction depths in the range of about 20–50 nm to be achieved.

The quantum conductive layers of the invention may be formed by various methods. The choice of method may depend on the composition of the surface on which the layer is to be formed and/or the desired quantum conductive layer composition.

Where the exposed surface on which the layer is to be formed has a high silicon content (e.g., a conventional (doped or undoped) polycrystalline, amorphous or monocrystalline silicon), the quantum conductive layer is preferably formed by reacting a portion of the silicon at the exposed surface with a nitrogen-containing compound in the atmosphere contacting the surface. Preferred nitrogen-containing compounds are those which are easily handled in a gaseous state. Examples of preferred nitrogen compounds are selected from the group consisting of ammonia, NO, $N_2O$ or (under plasma conditions) monatomic nitrogen. Ammonia is the preferred nitrogen compound. The atmosphere may also contain one or more diluent gases such as $N_2$, helium or argon. The partial pressure of the nitrogen compound is preferably about 1–760 Torr, more preferably, about 5–10 Torr. The reaction is typically facilitated by heating to a temperature of about 300–950° C., more preferably about 350–750° C. The reaction may be conducted until the desired layer thickness is formed. Preferably, the reaction is conducted for about 1–30 minutes, more preferably about 10–20 minutes. The reaction is typically self-limiting under these conditions.

If desired, the exposed diffusion surface may be pre-cleaned by a chemical etch (e.g., HF solution) and/or by a high temperature (e.g., about 900°–1000° C.) bake in a hydrogen atmosphere (or other appropriate reducing atmosphere) to remove some or all of any pre-existing oxide surface layer. The techniques described in U.S. Pat. No. 5,194,397 may also be used to control the presence of oxide film. Other known methods for removal of residual films may also be used where appropriate.

Where an oxynitride quantum conductive layer is desired, the above nitrogen reaction process may be conducted with a substrate having a pre-existing very thin oxide layer. In such instances, the relative contents of oxygen and nitrogen in the quantum conductive layer can be controlled by the temperature and time of the nitrogen compound reaction, with higher temperatures and longer reaction times giving a more nitrogen-rich layer. Alternatively, if desired, oxynitride layers may be formed by introducing a very minor amount of oxygen into the nitrogen compound-containing atmosphere. In general, this method is less preferred since control of the oxygen content and/or layer thickness may be difficult.

Where reaction of the underlying surface is not desired or not practical, the quantum conductive layer may be formed by chemical vapor deposition. In such instances, the reactants for forming the quantum conductive layer may be those typically used to form a layer of the corresponding dielectric material, however the reaction conditions (time, temperature, pressure) and/or proportions of the reactants must be appropriately reduced to avoid deposition of an excessively thick film. See, for example, the process for forming germanium oxide thin films described in U.S. Pat. Nos. 5,648,861 and 5,051,786, the disclosures of which are incorporated herein by reference. Alternative methods for forming the desired films may be found in the "Handbook of Thin Film Technology" by Maissel & Glang, McGraw-Hill Book Co. (1970) and in similar treatises. Appropriate etching techniques may be used to reduce excess film thickness where necessary.

Other process variations may be used to form the structures of the invention as may be apparent to those skilled in the art.

What is claimed is:

1. A structure on a semiconductor substrate, said structure comprising (a) a shallow doped region in said substrate, and (b) a doped polysilicon electrical contact to said shallow doped region, wherein said structure further comprises (c) a quantum conductive barrier layer between said doped region and said electrical contact, said doped region being electrically connected to said electrical contact through said quantum conductive barrier layer.

2. The structure of claim 1 wherein said shallow doped region is a source or drain for a transistor.

3. The structure of claim 1 wherein said shallow doped region has a depth of about 20–50 nm.

4. The structure of claim 1 wherein said quantum conductive barrier layer consists of a material selected from the group consisting of silicon nitride, silicon oxynitride, alumina, germanium oxide and yttria-stabilized zirconia.

5. The structure of claim 4 wherein said quantum conductive barrier layer consists of a material selected from the group consisting of silicon nitride, silicon oxynitride.

6. The structure of claim 1 wherein said quantum conductive layer has a thickness of less than about 50 Å.

7. The structure of claim 1 wherein said quantum conductive layer has a thickness of about 5–30 Å.

8. The structure of claim 1 wherein said quantum conductive barrier layer consists of a material having a bulk resistivity of at least about $10^6$ ohm-m.

9. The structure of claim 1 wherein said quantum conductive barrier layer consists of a material having a bulk resistivity of at least about $10^{11}$ ohm-m.

* * * * *